US 6,552,910 B1

(12) United States Patent
Moon et al.

(10) Patent No.: US 6,552,910 B1
(45) Date of Patent: Apr. 22, 2003

(54) STACKED-DIE ASSEMBLIES WITH A PLURALITY OF MICROELECTRONIC DEVICES AND METHODS OF MANUFACTURE

(75) Inventors: Ow Chee Moon, Singapore (SG); Eng Meow Koon, Singapore (SG)

(73) Assignee: Micron Technology, Inc., Boise, ID (US)

( * ) Notice: Subject to any disclaimer, the term of this patent is extended or adjusted under 35 U.S.C. 154(b) by 2 days.

(21) Appl. No.: 09/606,432

(22) Filed: Jun. 28, 2000

(51) Int. Cl.⁷ ................................................. H05K 1/00

(52) U.S. Cl. ...................... 361/749; 361/808; 361/790; 361/760; 257/698; 257/770; 438/111; 438/110

(58) Field of Search ................................ 361/749, 719, 361/803, 760, 764, 790, 808, 820; 257/698, 778, 707; 438/107, 108, 109, 110, 111

(56) References Cited

U.S. PATENT DOCUMENTS

| | | |
|---|---|---|
| 5,128,831 A | 7/1992 | Fox, III et al. |
| 5,222,014 A | 6/1993 | Lin |
| 5,252,857 A | 10/1993 | Kane et al. |
| 5,323,060 A | 6/1994 | Fogal et al. |
| 5,776,797 A * | 7/1998 | Nicewarner, Jr. et al. ... 438/107 |
| 5,793,101 A | 8/1998 | Kuhn |
| 5,946,553 A | 8/1999 | Wood et al. |
| 5,986,209 A | 11/1999 | Tandy |
| 5,990,566 A | 11/1999 | Farnworth et al. |
| 6,020,624 A | 2/2000 | Wood et al. |
| 6,020,629 A | 2/2000 | Farnworth et al. |

(List continued on next page.)

OTHER PUBLICATIONS

U.S. patent application Ser. No. 09/634,056, Jiang and Brooks, filed Aug. 09, 2000.
U.S. patent application Ser. No. 09/944,723, Moon, filed Aug. 30, 2001.
U.S. patent application Ser. No. 09/644,766, Corisis, filed Aug. 23, 2000.
"3–D IC Packaging." *3–D IC Packaging Industry News.* Semiconductor International May 1998. http://www.semiconductor.net/semiconductor/archive/May98/docs/ind_news2.html (Dec. 30, 1999).
Plößl, A. and Kräuter, G., "Wafer direct bonding: tailoring adhesion between brittle materials," *Materials Science and Engineering* R25(1–2): pp. 1–88, 1999.

*Primary Examiner*—David Martin
*Assistant Examiner*—Hung Bui
(74) *Attorney, Agent, or Firm*—Perkins Coie LLP

(57) ABSTRACT

A stacked-die assembly and a method of manufacturing a stacked-die assembly having a plurality of microelectronic devices. In one embodiment, a stacked-die assembly can include a first die, a second die juxtaposed to the first die, and an interface substrate coupled to the first and second dies. The first die can have a first integrated circuit and a first terminal array coupled to the first integrated circuit, and the second die can have a second integrated circuit and a second terminal array coupled to the second integrated circuit. The interface substrate can comprise a body, a first contact array on the body that is electrically coupled to the first terminal array of the first die, a second contact array on the body that is electrically coupled to the second terminal array of the second die, and at least one ball-pad array on the body. The interface substrate can also include interconnecting circuitry electrically coupling at least a portion of the first and second contact arrays with at least a portion of the first ball-pad array.

26 Claims, 5 Drawing Sheets

U.S. PATENT DOCUMENTS

| | | | |
|---|---|---|---|
| 6,028,365 | A | 2/2000 | Akram et al. |
| 6,051,878 | A | 4/2000 | Akram et al. |
| 6,072,233 | A | 6/2000 | Corisis et al. |
| 6,072,236 | A | 6/2000 | Akram et al. |
| 6,100,594 | A | 8/2000 | Fukui et al. |
| 6,121,676 | A | 9/2000 | Solberg |
| 6,154,366 | A | 11/2000 | Ma et al. |
| 6,160,718 | A * | 12/2000 | Vakilian ............... 361/803 |
| 6,175,149 | B1 | 1/2001 | Akram |
| 6,212,767 | B1 | 4/2001 | Tandy |
| 6,222,265 | B1 | 4/2001 | Akram et al. |
| 6,225,689 | B1 | 5/2001 | Moden et al. |
| 6,235,554 | B1 | 5/2001 | Akram et al. |
| 6,258,623 | B1 | 7/2001 | Moden et al. |
| 6,262,895 | B1 * | 7/2001 | Forthun ............... 361/749 |
| 6,281,577 | B1 | 8/2001 | Oppermann et al. |
| 6,294,839 | B1 | 9/2001 | Mess et al. |
| 6,297,547 | B1 | 10/2001 | Akram |
| 6,303,981 | B1 | 10/2001 | Moden |

* cited by examiner

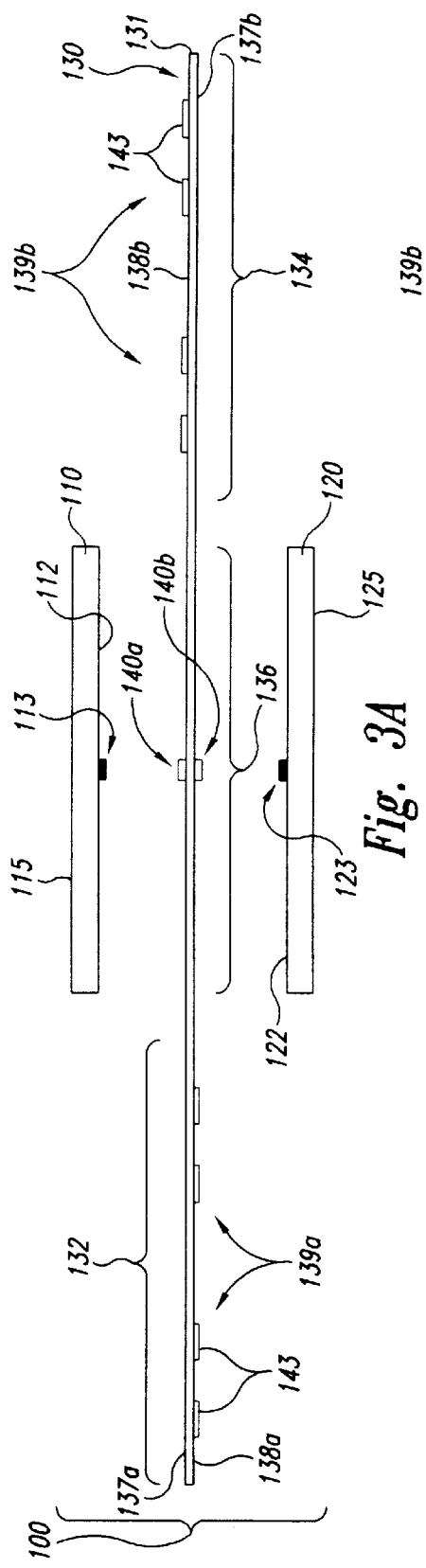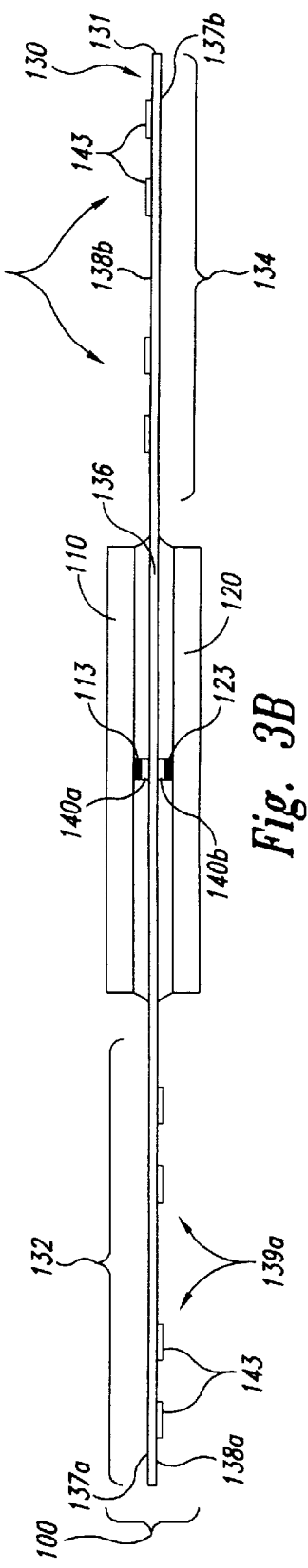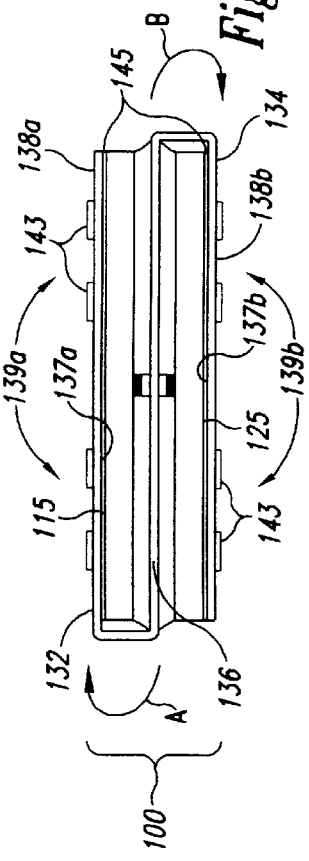

STACKED-DIE ASSEMBLIES WITH A PLURALITY OF MICROELECTRONIC DEVICES AND METHODS OF MANUFACTURE

TECHNICAL FIELD

This invention relates to assemblies having a plurality of microelectronic devices stacked on each other, and methods for manufacturing such stacked microelectronic device assemblies.

BACKGROUND

Microelectronic devices, such as memory devices and microprocessors, typically include a microelectronic die encased in a plastic, ceramic or metal protective covering. The die includes functional features, such as memory cells, processor circuits, and interconnecting circuitry. The die also typically includes an array of very small bond pads electrically coupled to the functional features. The bond pads are coupled to terminals, such as pins, that extend outside of the protective covering for operatively connecting the microelectronic dies to buses, circuits and/or other microelectronic devices.

Conventional microelectronic devices are typically arranged side-by-side on a circuit board or other support device that can be incorporated into a computer, mobile phone or other electronic product. One drawback with this arrangement is that the circuit board may need a large surface area to accommodate a large number of microelectronic devices. Accordingly, it may be difficult to fit the circuit board into a housing of a compact electronic product.

One technique to resolve this problem is to stack one microelectronic die on top of another to reduce the surface area on the printed circuit board occupied by the dies. The microelectronic dies are typically connected to each other with an adhesive layer that is heat cured to form a secure bond between the dies. Stacking dies, however, presents many challenges that are not applicable to single-die packages. For example, when two different types of devices are stacked on each other (e.g., a flash-memory device stacked on an SRAM device), such a stacked-die assembly requires multiple test sockets, different handling devices, and multiple test programs to test the individual types devices. In the case of a stacked-die assembly having a flash-memory device and an SRAM device, the fabricating facility must accordingly have a test socket and a test program for each of the flash-memory device and the SRAM device. Stacked-die assemblies with two types of devices accordingly require a significant capital expenditure for the test equipment and a significant amount of skilled labor to perform the individual testing programs.

Another drawback of conventional techniques for stacking dies is that the wire-bond routing from the dies to the circuit board is complex. Typical stacked-die assemblies connect the terminals on the dies to the printed circuit board (PCB) or an interposer substrate using wire-bond connections and/or ball grid arrays. It is complex to form the wire-bond connections on a conventional stacked assembly because the contacts from both of the dies must be routed to correct locations on the PCB or the interposer substrate. The available space on the PCB or the interposer substrate, however, is generally a small area that cannot accommodate the wire bonding of both devices. It will be appreciated that wire-bonding is also expensive and may not produce robust connections.

Still another drawback of conventional stacked-die assemblies is that it is difficult to stack one two-die assembly to another single or multiple-die assembly. In conventional stacked-die assemblies, each die has a separate assembly of ball-pads for coupling each die to a PCB or an interposer substrate. As such, conventional stacked-die assemblies do not allow more than two dies to be stacked together in a single assembly. Therefore, it is difficult to increase the capacity (e.g., the memory capacity of like memory devices) or the function (e.g., combining a flash-memory device and an SRAM device) beyond the two-die stacked-die assemblies that are currently the state of the art.

SUMMARY

The present invention is directed toward stacked-die assemblies, interface substrates for stacked die assemblies, and methods of manufacturing stacked-die assemblies having a plurality of microelectronic devices. In one embodiment, a stacked-die assembly can include a first die, a second die juxtaposed to the first die, and an interface substrate coupled to the first and second dies. The first die can have a first integrated circuit and a first terminal array coupled to the first integrated circuit, and the second die can have a second integrated circuit and a second terminal array coupled to the second integrated circuit. The interface substrate can comprise a body, a first contact array on the body that is electrically coupled to the first terminal array of the first die, a second contact array on the body that is electrically coupled to the second terminal array of the second die, and at least one ball-pad array on the body. The interface substrate can also include interconnecting circuitry electrically coupling at least a portion of the first and second contact arrays with at least a portion of the first ball-pad array.

BRIEF DESCRIPTION OF THE DRAWINGS

FIGS. 3A–3C are side elevation views illustrating a method for assembling a stacked-die assembly in accordance with an embodiment of the invention.

DETAILED DESCRIPTION

The following description is directed toward stacked-die assemblies having a plurality of microelectronic devices stacked on each other, interface substrates for facilitating the stacking of microelectronic devices, and methods for manufacturing stacked-die assemblies. The terms "substrate interface" and "coupling member" are used herein to mean any type of device for coupling a microelectronic device to a printed circuit board, another microelectronic device, or another type of device. Many specific details of several embodiments are described below with reference to memory devices and semiconductor wafers to provide a thorough understanding of such embodiments. The present invention, however, can be practiced using other types of microelectronic devices. A person skilled in the art will thus understand that the invention may have additional embodiments, or that the invention may be practiced without several of the details described in this section.

Figure 1:
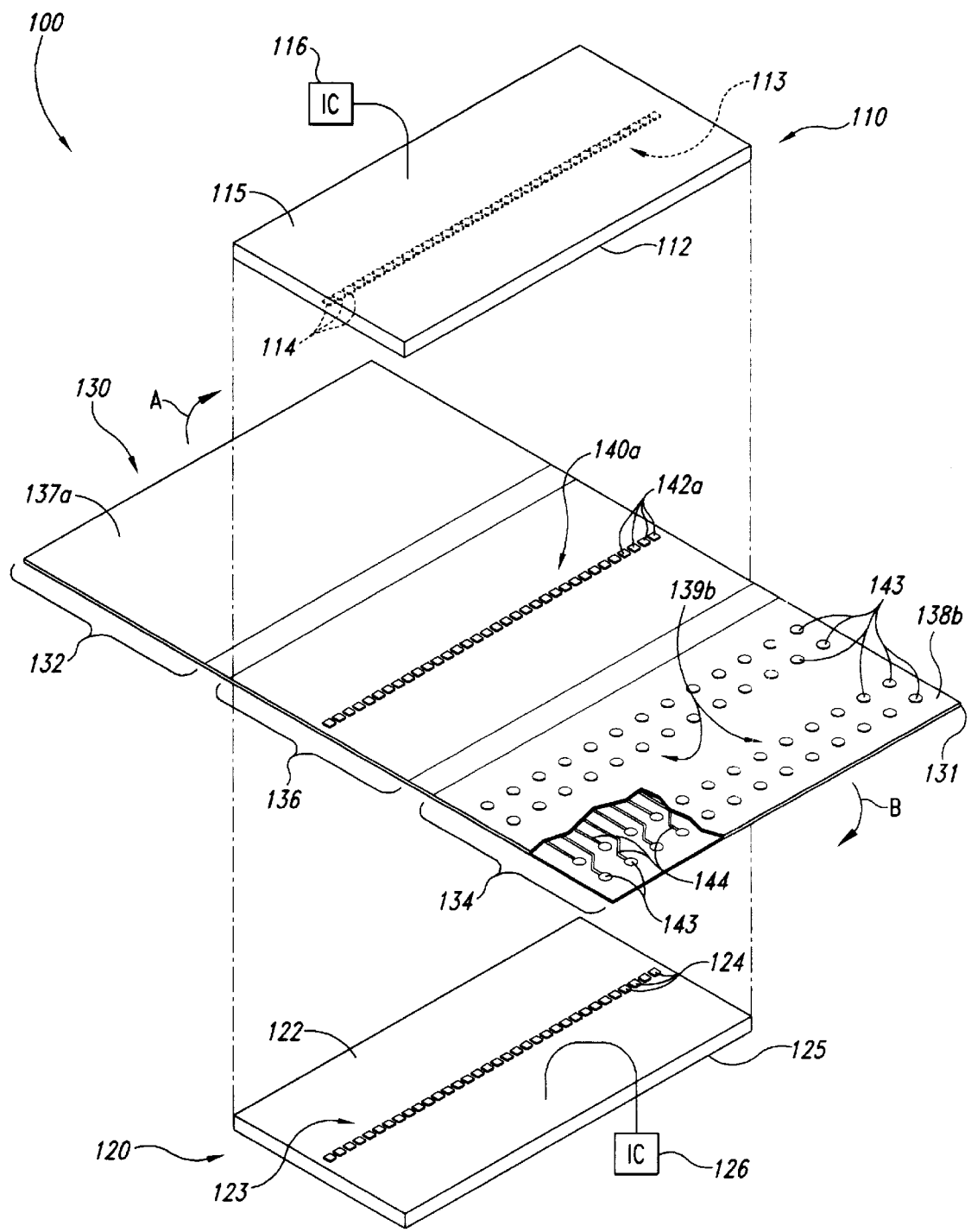
FIG. 1 is an exploded isometric view of a stacked-die assembly having a plurality of microelectronic devices in accordance with one embodiment of the invention.

FIG. 1 is an exploded isometric view of a stacked-die assembly 100 including a first die 110, a second die 120, and an interface substrate or coupling member 130 attached to the first and second dies 110 and 120. The first die 110 generally has an interior surface 112, a first terminal array 113 including a plurality of first terminals 114 extending along the interior surface 112, an exterior surface 115, and at least one integrated circuit 116 (shown schematically). The second die 120 can have an inner surface 122, a second terminal array 123 having a plurality of second terminals 124 extending along the inner surface 122, an outer surface 125, and at least one second integrated circuit 126 (shown schematically). The terminal arrays 113 and 123 can be center arrays (as shown), periphery arrays, or other configurations for connecting the integrated circuits 116 and 126 to other components. The terminal arrays 113 and 123 are typically gold bumps or solder bumps that have a very fine pitch of 0.075 mm, but the terminal arrays 113 and 123 can be made from other materials and have other pitches. The first and second dies 110 and 120 can be SRAM, DRAM, flash-memory, processors and other types of microelectronic devices. The first and second dies 110 and 120 can be the same type of devices (e.g., SRAM devices), or they can be multiple-function assemblies with multiple types of devices (e.g., a flash-memory device and an SRAM device).

Figure 2:
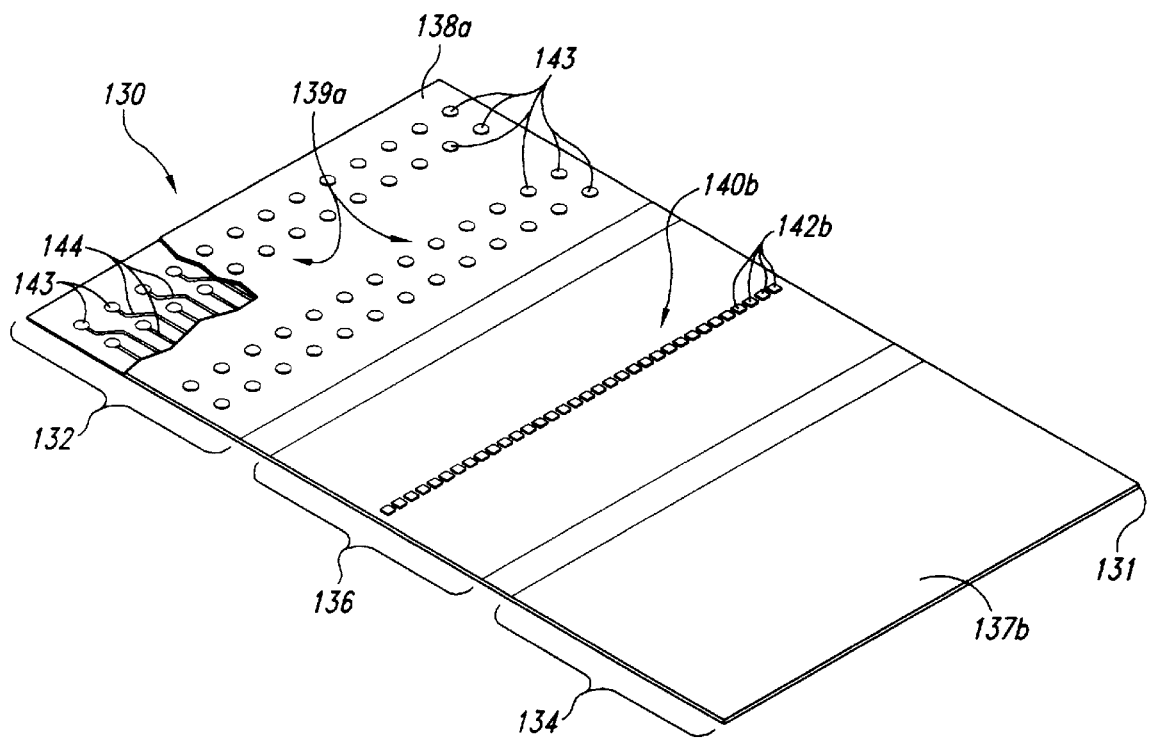
FIG. 2 is a bottom isometric view of an embodiment of an interface substrate for use with the stacked-die assembly of FIG. 1.

The interface substrate 130 or coupling member can be a thin, flexible substrate or tape that bonds or adheres to the first and second dies 110 and 120. FIG. 1 is a top isometric view of an embodiment of the interface substrate 130, and FIG. 2 is a bottom isometric view of the same interface substrate 130. Referring to FIGS. 1 and 2 together, the interface substrate 130 can include a body 131 having a first section 132, a second section 134, and an intermediate section 136. In the embodiment shown in FIGS. 1 and 2, the first section 132 is on one end of the intermediate section 136, and the second section 134 is on the other end of the intermediate section 136. Suitable ribbons or tapes from which the interface substrate 130 can be made are manufactured by 3M Corporation of Minnesota.

The intermediate section 136 of the embodiment shown in FIGS. 1 and 2 has a first contact array 140a with a plurality of contacts 142a (FIG. 1) and a second contact array 140b with a plurality of second contacts 142b (FIG. 2). The first contacts 142a in the first contact array 140a are configured to contact respective terminals 114 of the first terminal array 113 on the first die 110. Similarly, the second contacts 142b of the second contact array 140b are configured to contact respective terminals 124 of the second terminal array 123 on the second die 120. In this embodiment, the first die 110 is mounted on one side of the intermediate section 136 and the second die 120 is mounted on the other side of the intermediate section 136.

The embodiments of the first and second sections 132 and 134 shown in FIGS. 1 and 2 provide separate ball-pad arrays for distributing the fine-pitch, high-density terminals 114 and 124 to a larger pitch that can be attached to a printed circuit board or another microelectronic device. The first section 132 can include a first contact surface 137a (FIG. 1) for engaging the exterior surface 115 of the first die 110, and the second section 134 can include a second contact surface 137b (FIG. 2) for contacting the outer surface 125 of the second die 120. The first section 132 can also include a first access surface 138a (FIG. 2) with a first ball-pad array 139a, and the second section 134 can include a second access surface 138b (FIG. 1) with a second ball-pad array 139b. The first and second ball-pad arrays 139a and 139b can have a plurality of ball-pads 143 that are connected to the first contacts 142a of the first contact array 140a and/or the second contacts 142b of the second contact array 140b by interconnecting circuitry 144. The first and second ball-pad arrays 139a and 139b can be identical or they can have different configurations. In one embodiment, for example, the first and second ball-pad arrays 139a and 139b are identical arrays in which all of the contacts 142a and 142b on the intermediate section 136 are connected to the same respective ball-pads 143 on both the first and second ball-pad arrays 139a and 139b. The ball-pad arrays 139a and 139b can further include additional ball-pads for electrically coupling one stacked-die assembly onto another to form a multiple stacked-die assembly. In another embodiment, the first contacts 142a can be coupled to only one of the first or second ball-pad arrays 139a or 139b, and the second contacts 142b can be coupled to only the other one of the first or second ball-pad arrays 139a or 139b. In still another embodiment, one portion of the first contacts 142a can be coupled to the first ball-pad array 139a and another portion of the first contacts 142a can be coupled to the second ball-pad array 139b. The ball-pad arrays 139a and 139b can accordingly have several different configurations.

FIGS. 3A–3C are side elevation views illustrating an embodiment of a process for manufacturing the stacked-die assembly 100 shown in FIGS. 1 and 2. The reference numbers in FIGS. 3A–3C correspond to the reference numbers in FIGS. 1 and 2, and thus like reference numbers refer to like components in FIGS. 1–3C. Referring to FIG. 3A, the first and second dies 110 and 120 are aligned with the intermediate section 136 of the interface substrate 130 such that the first terminal array 113 of the first die 110 is superimposed over the first contact array 140a, and the second terminal array 123 of the second die 120 is aligned with the second contact array 140b. Referring to FIG. 3B, the first and second dies 110 and 120 are adhered to the intermediate section 136 of the interface substrate 130. The first and second dies 110 and 120 can be adhered to the intermediate section 136 using a flowable underfill, anisotropic conductive films, anisotropic conductive pastes, thermal compression techniques, thermalsonic techniques, no-flow underfill techniques, or other techniques that are known to persons skilled in the art. Referring to FIG. 3C, the first section 132 of the interface substrate 130 is folded up (arrow A) to engage the first contact surface 137a with the exterior surface 115 of the first die 110. The second section 134 of the interface substrate 130 is folded down (arrow B) so that the second contact surface 137b engages the outer surface 125 of the second die 120. The first and second contact surfaces 137a and 137b of the interface substrate 130 are generally adhered to the first and second dies 110 and 120 by an adhesive 145. Once the first and second sections 132 and 134 of the interface substrate 130 are adhered to the first and second dies 110 and 120, the stacked-die assembly 100 is ready for testing and receiving solder balls on the ball-pads 143.

The embodiment of the stacked-die assembly 100 shown in FIGS. 1–3C is expected to reduce capital expenditures and operating costs for testing stacked-die assemblies. One feature of several embodiments of the stacked-die assembly 100 is that all of the terminals in the first and second terminal arrays 113 and 123 of the first and second dies 110 and 120 can be coupled to the ball-pads 143 of the first ball-pad array 139a and/or the second ball-pad array 139b. As a result, both of the first and second dies 110 and 120 can be tested in a single test handler using the same test sockets, the same burn-in board, the same test program, and the same test procedure. Additionally, if the first and second ball-pad arrays 139a and 139b are identical to each other, the dies 110 and 120 can be tested with the same test handler even when the first die 110 is a different type of die than the second die 120.

Several embodiments of the stacked-die assembly 100 shown in FIG. 1–3C are also expected to simplify the packaging process for creating stacked-die assemblies. For example, when the first and second ball-pad arrays 139a and 139b are identical arrays in which all of the terminals in both the first terminal array 113 of the first die 110 and the second terminal array 123 of the second die 120 are coupled to corresponding ball-pads 143 in each array 139a and 139b, then the only process step that needs to be customized for a specific stacked-die assembly is the pattern of solder balls placed on the ball-pad arrays 139a and/or 139b at the end of the assembly/testing procedure. Therefore, the interface substrate 130 simplifies the process of fabricating stacked-die assemblies.

Several embodiments of the stacked-die assembly 100 are also expected to reduce the cost of manufacturing interface substrates. In conventional systems, an individual interface substrate must be designed and manufactured for each type of die in a stacked-die assembly. In the embodiments of the stacked-die assembly 100 shown in FIGS. 1–3C in which the first and second ball-pad assemblies 139a and 139b are identical, a single mask and tooling system is required for fabricating the interface substrate 130. Therefore, several embodiments of the stacked-die assembly 100 are expected to reduce the cost of assembling microelectronic devices.

Figure 4:
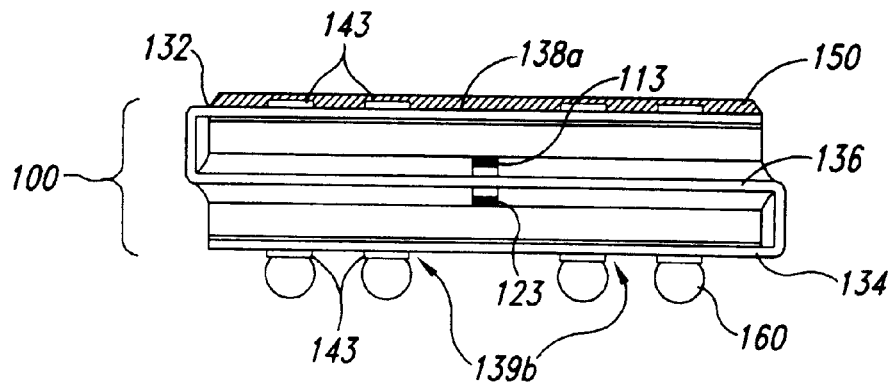
FIG. 4 is a side elevation view of one embodiment of a stacked-die assembly in accordance with an embodiment of the invention.

FIG. 4 is a side elevation view of another embodiment of the stacked-die assembly 100. In this embodiment, the ball-pads 143 on the first access surface 138a of the first section 132 are covered with an insulation layer 150. Additionally, a plurality of solder balls 160 are deposited onto individual ball-pads 143 of the second ball-pad array 139b. The solder balls 160 are generally distributed in a pattern to couple the terminals of the first and second terminal arrays 113 and 123 to appropriate points on a printed circuit board or another type of component.

Figure 5:
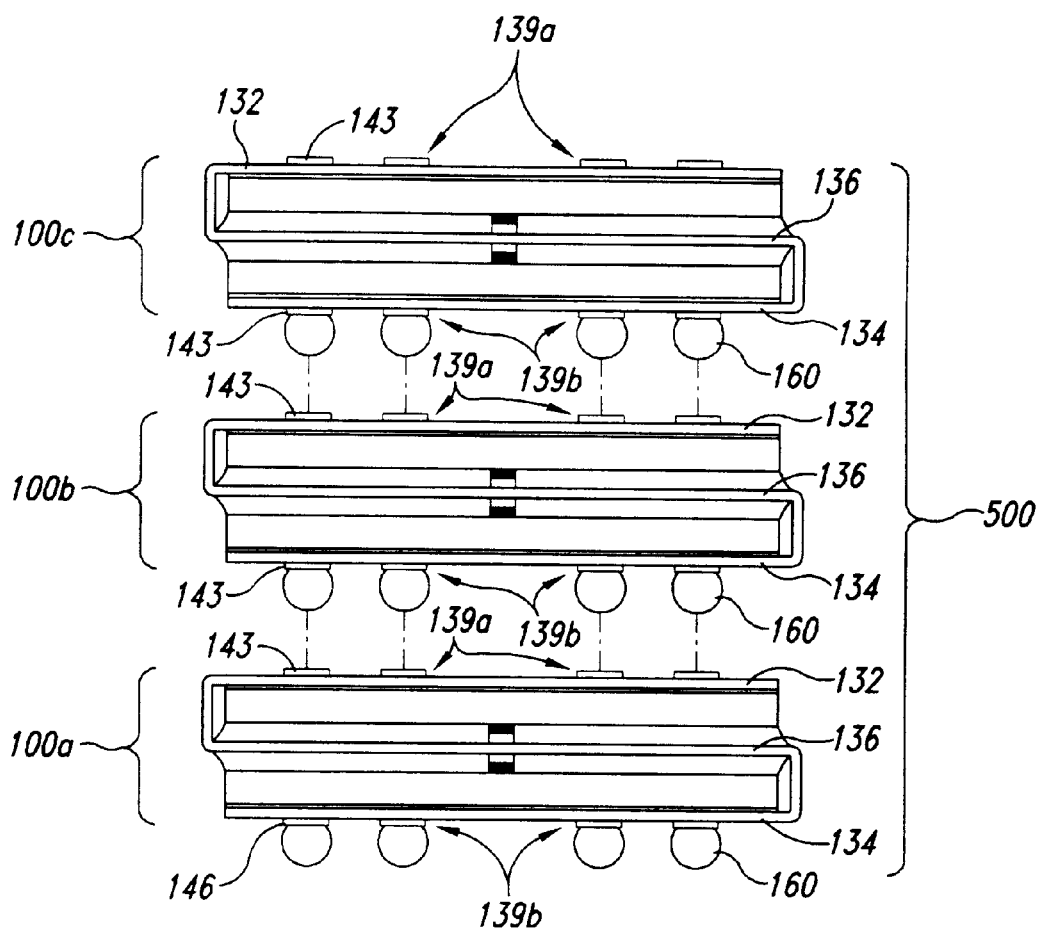
FIG. 5 is a side elevation view of a stacked-die assembly in accordance with another embodiment of the invention.

FIG. 5 is a side elevation view of a multiple stacked-die assembly 500 in accordance with another embodiment of the invention. In this embodiment, the multiple stacked-die assembly 500 includes a plurality of individual stacked-die assemblies 100a–100c. Each of the individual stacked-die assemblies 100a–100c can be the same as the stacked-die assembly 100 described above with reference to FIGS. 1–3C. In this embodiment, a plurality of solder balls 160 are deposited onto the ball-pads 143 of the second ball-pad array 139b of each of the stacked-die assemblies 100a–100c. The second stacked-die assembly 100b is coupled to the first stacked-die assembly 100a by contacting the solder balls 160 on the second ball-pad array 139b of the second stacked-die assembly 100b with selected ball-pads 143 of the first ball-pad array 139a of the first stacked-die assembly 100a. The third stacked-die assembly 100c can be similarly coupled to the second stacked-die assembly 100b. The multiple stacked-die assembly 500 can have any number of individual stacked-die assemblies 100, and it is not necessarily limited to having three stacked-die assemblies. For example, the multiple stacked-die assembly 500 can have two or more individual stacked-die assemblies.

The multiple stacked-die assembly 500 illustrated in FIG. 5 provides a significant increase in the configurations of stacked microelectronic devices. In one embodiment, all of the individual dies can be the same type of microelectronic device to significantly increase the capacity of a component without occupying a greater surface area on the printed circuit board. The microelectronic devices, for example, can all be SRAM or DRAM devices to increase the memory capacity of a component. In other embodiments in which the individual microelectronic devices are different types of devices, then the multiple stacked-die assembly 500 significantly increases the number of functions of a component because many different types of devices can be mounted onto the same surface area of a printed circuit board.

The first stacked-die assembly 100a of the multiple stacked-die assembly 500 in FIG. 5 can be mounted to a printed circuit board to couple all of the stacked-die assemblies 100a–100c to the printed circuit board. In this example, the first ball-pad array 139a of the first stacked-die assembly 100a has ball-pads 143 that are configured to contact the solder balls 160 depending from the ball-pads 143 on the second ball-pad array 139b of the second stacked-die assembly 100b. The interface substrate 130 of the first stacked-die assembly 100a can accordingly have interconnecting circuitry 144 with a pass-through circuit to couple the ball-pads 143 on the first ball-pad array 139a of the first stacked-die assembly 100a that contact the solder balls 160 depending from the second ball-pad array 139b of the second stacked-die assembly 100b with the desired ball-pads 143 on the second ball-pad array 139b of the first stacked-die assembly 100a. Such a pass-through circuit allows the interface substrate 130 of the first stacked-die assembly 100a to be a conduit for the second stacked-die assembly 100b. The interface substrate 130 of each of the first and second stacked-die assemblies 100a and 100b can also be configured with pass-through circuits that coupled the third stacked-die assembly 100c to a printed circuit board via the first and second stacked-die assemblies 100a and 100b.

Figure 6:
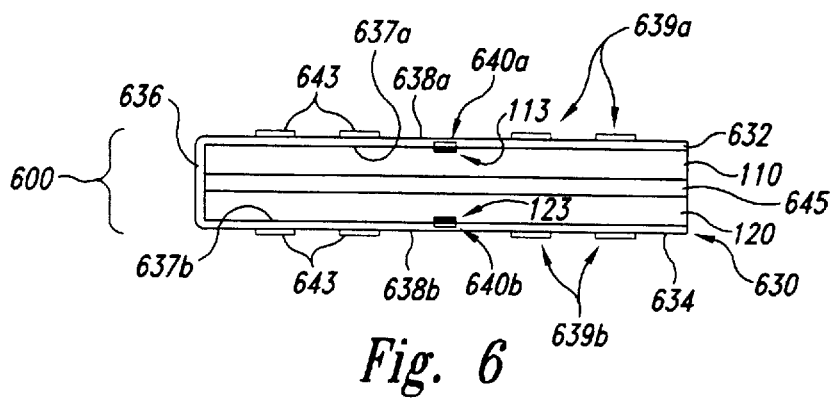
FIG. 6 is a side elevation view of a stacked-die assembly in accordance with yet another embodiment of the invention.

FIG. 6 is a elevation view of another stacked-die assembly 600 in accordance with another embodiment of the invention. In this embodiment, the stacked-die assembly 600 includes a first die 110, a second die 120, and an interface substrate 630 attached to the first and second dies 110 and 120. The first and second dies 110 and 120 can be similar to those described above with respect to FIGS. 1–3C, and thus like reference numbers refer to like parts in FIGS. 1–3C and 6. Unlike the stacked-die assembly 100 in FIGS. 1–3C, however, the interior surface of the first die 110 in the stacked-die assembly 600 is bonded to the inner surface of the second die 120 by an adhesive 645. The first terminal array 113 is accordingly on the exterior surface of the first die 110, and the second terminal array 123 is on the outer surface of the second die 120. As such, the first and second terminal arrays 113 and 123 face outwardly away from each other in the stacked-die assembly 600.

Figure 7:
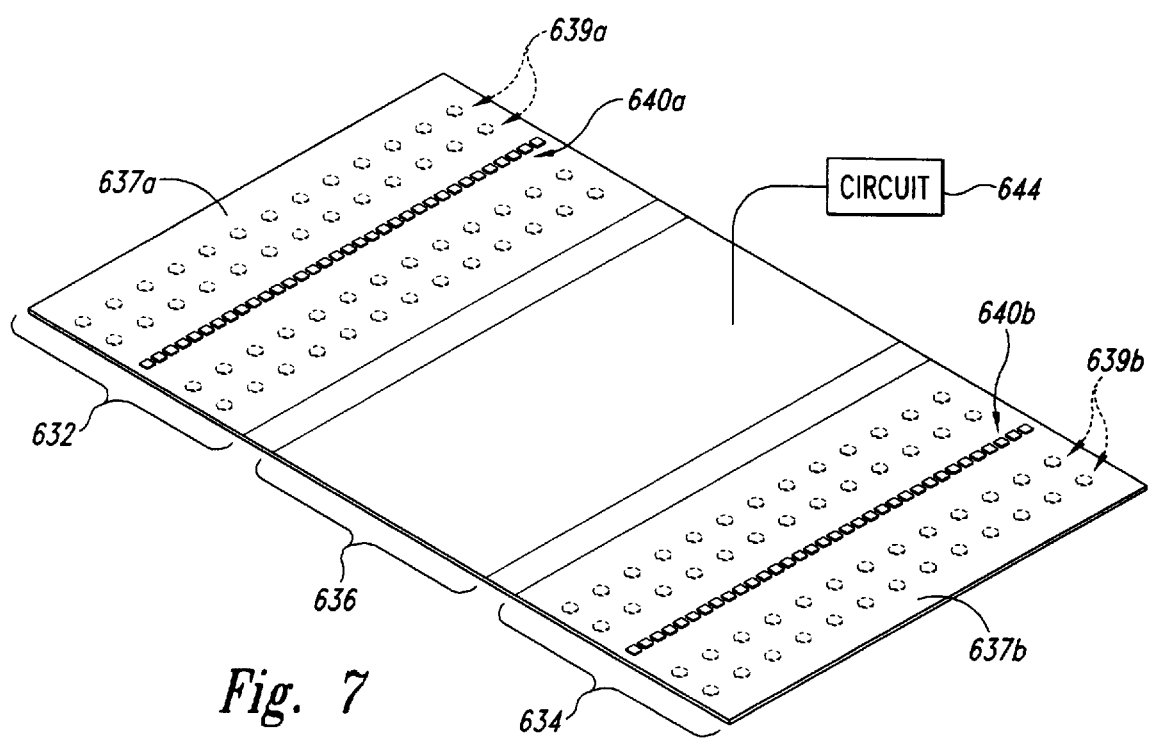
FIG. 7 is a top isometric view of an embodiment of an interface substrate for use with the stacked-die assembly of FIG. 6.

The interface substrate 630 has a body with a first section 632, a second section 634, and an intermediate section 636 between the first and second sections 632 and 634. FIG. 7 is a top isometric view of the interface substrate 630 of the stacked-die assembly 600 shown in FIG. 6. Referring to FIGS. 6 and 7 together, the first section 632 of the interface substrate 630 can have a first contact surface 637a, a first access surface 638a, a first ball-pad array 139a including a plurality of ball-pads 643 on the first access surface 638a, and a first contact array 640a on the first contact surface 637a. The second section 634 of the interface substrate 630 can similarly include a second contact surface 637b, a second access surface 638b, a second ball-pad array 639b including a plurality of ball-pads 643 on the second access surface 638b, and a second contact array 640b on the second contact surface 637b. The first contact array 640a engages the first terminal array 113 of the first die 110, and the second contact array 640b engages the second terminal array 123 of the second die 120. The first and second contact arrays 640a and 640b can be electrically coupled to the ball-pads 643 of the first ball-pad array 639a and/or the second ball-pad array 639b by interconnecting circuitry 644 (shown schematically) in or on the interface substrate 630. It will be appreciated that the first and second contact arrays 640a and 640b, and the first and second ball-pad arrays 639a and 639b, can have the same configurations as described above with respect to FIGS. 1–5.

Figure 8:
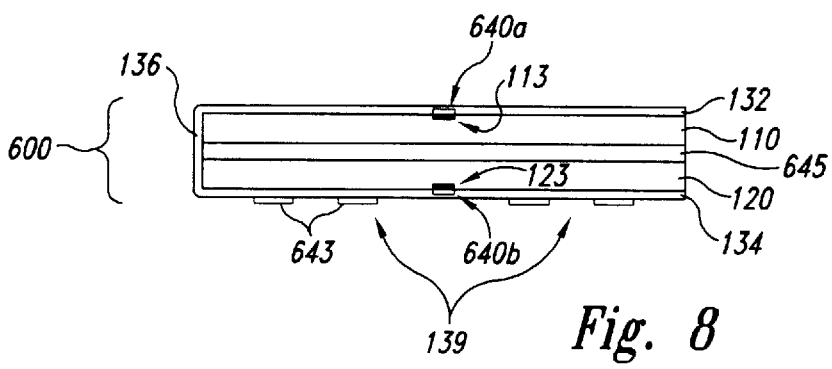
FIG. 8 is a side elevation view of a stacked-die assembly in accordance with another embodiment of the invention.

FIG. 8 is a side elevation view of another embodiment of the stacked-die assembly 600 in which the interface substrate 630 has only one ball-pad array 139 on the second section 134. It will be appreciated that the single ball-pad array 139 shown in this embodiment can alternatively be on the first section 132 depending upon the particular application for the stacked-die assembly 600. The interconnecting circuitry 644 accordingly couples both the first and second contact arrays 640a and 640b to the ball-pad array 139 on either the first or the second sections 132 or 134. This embodiment of the stacked-die assembly 600 is particularly well suited for being a sole stacked-die assembly or the top stacked-die assembly of a multiple stacked-die assembly because the section of the interface substrate that does not have a ball-pad array electrically insulates the assembly without requiring a separate insulation layer.

From the foregoing it will be appreciated that the embodiments of the invention described above provide the best mode of the invention and provide sufficient disclosure to enable a person skilled in the art to make and use these embodiments, but that modifications may be made to these embodiments that add or delete features without deviating from the spirit and scope of the invention. Therefore, the scope of the invention is not limited except as defined only by the claims that follow.

What is claimed is:

1. A stacked-die assembly, comprising:
   a first die having a first integrated circuit and a first terminal array coupled to the first integrated circuit;
   a second die having a second integrated circuit and a second terminal array coupled to the second integrated circuit, the second die being juxtaposed to the first die;
   an interface substrate comprising a body, a first contact array on the body and electrically coupled to the first terminal array of the first die, a second contact array on the body electrically coupled to the second terminal array on the second die, at least a first ball-pad array on the body spaced apart from the first and second contact arrays, and interconnecting circuitry electrically coupling at least a portion of the first and second contact arrays with at least a portion of the first ball-pad array, wherein
   the body has a first section, a second section, and an intermediate section between the first and second sections;
   the first die has an interior surface and an exterior surface, and the first terminal array being on the exterior surface;
   the second die has an inner surface and an outer surface, the second terminal array being on the outer surface, and the inner surface of the second die being attached to the interior surface of the first die;
   the first section of the body has a first contact surface attached to the exterior surface of the first die and a first access surface facing away from the first die, the first contact array being on the first contact surface and engaged with the first terminal array on the first die, and the first ball-pad array being on the first access surface;
   the second section of the body has a second contact surface attached to the outer surface of the second die and a second access surface facing away from the second die, the second contact array being on the second contact surface and engaged with the second terminal array on the second die; and
   the interface substrate further comprises a second ball-pad array on the second access surface of the second section of the body.

2. The stacked-die assembly of claim 1 wherein the interface substrate has a C-shape.

3. The stacked-die assembly of claim 1 wherein the first and second ball-pad arrays are identical.

4. The stacked-die assembly of claim 1 wherein the first and second ball-pad arrays are identical, and wherein the interconnecting circuitry couples all of the first and second contact arrays to each of the first and second ball-pad arrays.

5. The stacked-die assembly of claim 1 wherein the first and second ball-pad arrays are different from one another.

6. The stacked-die assembly of claim 1 wherein the first and second dies are the sane type of microelectronic device.

7. The stacked-die assembly of claim 1 wherein the first and second dies are different types of microelectronic devices.

8. A stacked-die assembly, comprising:
   a first die having an interior surface, an exterior surface, at least one first integrated circuit, and a first terminal array coupled to the first integrated circuit;
   a second die having an inner surface, an outer surface, at least one second integrated circuit, and a second terminal array coupled to the second integrated circuit, the inner surface of the second die being juxtaposed to the interior surface of the first die;
   an interface substrate comprising
      a flexible body comprising a first section with a first contact surface attached to the exterior surface of the first die and a first access surface facing away from the first die, a second section with a second contact surface attached to the outer surface of the second die and a second access surface facing away from the second die, and an intermediate section coupling the first section to the second section;
      a first contact array electrically coupled to the first terminal array of the first die;
      a second contact array electrically coupled to the second terminal array on the second die;
      a first ball-pad array on the first access surface of the first section;
      a second ball-pad array on the second access surface of the second section; and
      interconnecting circuitry electrically coupling at least a portion of each of the first and second contact arrays with at least a portion of each of the first and second ball-pad arrays.

9. The stacked-die assembly of claim 8 wherein the body has a serpentine shape, the first contact array is on one side of the intermediate section, and the second contact array is on another side of the intermediate section, and wherein the intermediate section is between the interior surface of the first die and the inner surface of the second die.

10. The stacked-die assembly of claim 9 wherein the first and second ball-pad arrays are identical.

11. The stacked-die assembly of claim 9 wherein the first and second ball-pad arrays are identical, and wherein the interconnecting circuitry couples all of the first and second contact arrays to each of the first and second ball-pad arrays.

12. The stacked-die assembly of claim 9 wherein the first and second ball-pad arrays are different from one another.

13. The stacked-die assembly of claim 8 wherein the first and second dies are the same type of microelectronic device.

14. The stacked-die assembly of claim 8 wherein the first and second dies are different types of microelectronic devices.

15. A stacked-die assembly, comprising:
   a first die having an interior surface, an exterior surface, at least one first integrated circuit, and a first terminal array on the interior surface electrically coupled to the first integrated circuit;
   a second die having an inner surface, an outer surface, at least one second integrated circuit, and a second terminal array on the inner surface electrically coupled to the second integrated circuit, the inner surface of the second die being juxtaposed to the interior surface of the first die;
   an interface substrate comprising
      a flexible web comprising a first section with a first contact surface attached to the exterior surface of the first die and a first access surface facing away from the first die, a second section with a second contact surface attached to the outer surface of the second die and a second access surface facing away from the second die, and an intermediate section coupling the first section to the second section with a first side attached to the interior surface of the first die and a second side attached to the inner surface of the second die;
      a first contact array on the first side of the intermediate section electrically coupled to the first terminal array of the first die;
      a second contact array on the second side of the intermediate section electrically coupled to the second terminal array on the second die;
      a first ball-pad array on the first access surface of the first section;
      a second ball-pad array on the second access surface of the second section; and
      interconnecting circuitry electrically coupling at least a portion of each of the first and second contact arrays with at least a portion of each of the first and second ball-pad arrays.

16. The stacked-die assembly of claim 15 wherein the interface substrate has a serpentine shape.

17. The stacked-die assembly of claim 15 wherein the first and second ball-pad arrays are identical.

18. The stacked-die assembly of claim 15 wherein the first and second ball-pad arrays are identical, and wherein the interconnecting circuitry couples all of the first and second contact arrays to each of the first and second ball-pad arrays.

19. The stacked-die assembly of claim 15 wherein the first and second ball-pad arrays are different from one another.

20. The stacked-die assembly of claim 15 wherein the first and second dies are the same type of microelectronic device.

21. The stacked-die assembly of claim 15 wherein the first and second dies are different types of microelectronic devices.

22. An interface device for coupling a first microelectronic die to a second microelectronic die in a stacked configuration in which an interior surface of the first die is juxtaposed to an inner surface of the second die, the interface device comprising:
   a body having a first section with a first contact surface configured to be attached to an exterior surface of the first die and a first access surface configured to face away from the first die, a second section with a second contact surface configured to be attached to an outer surface of the second die and a second access surface configured to face away from the second die, and an intermediate section coupling the first section to the second section;
   a first contact array configured to be electrically coupled to a first terminal array of the first die when the first contact surface of the first section is attached to the first die;
   a second contact array configured to be electrically coupled to a second terminal array on the second die when the second contact surface of the second section is attached to the second die;
   a first ball-pad array on the first access surface;
   a second ball-pad array on the second access surface; and
   an interconnecting circuit electrically coupling at least a portion of each of the first and second contact arrays with at least a portion of each of the first and second solder-ball arrays.

23. The interface device of claim 22 wherein the body and the interconnecting circuit are flexible to be folded in a shape conforming to a portion of the first and second dies.

24. The interface device of claim 23 wherein the first and second ball-pad arrays are identical.

25. The interface device of claim 23 wherein the first and second ball-pad arrays are identical, and wherein the interconnecting circuit couples all of the first and second contact arrays to each of the first and second ball-pad arrays.

26. The interface device of claim 23 wherein the first and second ball-pad arrays are different from one another.

* * * * *

UNITED STATES PATENT AND TRADEMARK OFFICE
CERTIFICATE OF CORRECTION

PATENT NO.   : 6,552,910 B1
DATED        : April 22, 2003
INVENTOR(S)  : Moon et al.

It is certified that error appears in the above-identified patent and that said Letters Patent is hereby corrected as shown below:

Column 1,
Line 45, add -- of -- between "types" and "devices";

Column 5,
Line 9, "bum-in" should be -- burn-in --;

Column 8,
Line 32, "sane" should be -- same --;

Signed and Sealed this

Second Day of March, 2004

JON W. DUDAS
*Acting Director of the United States Patent and Trademark Office*